United States Patent
Gao

(10) Patent No.: US 12,082,373 B2
(45) Date of Patent: Sep. 3, 2024

(54) TWO-PHASE SYSTEM IN SERVER CLUSTER

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 224 days.

(21) Appl. No.: 17/700,148

(22) Filed: Mar. 21, 2022

(65) Prior Publication Data
US 2023/0301024 A1 Sep. 21, 2023

(51) Int. Cl.
H05K 7/20 (2006.01)

(52) U.S. Cl.
CPC ..... H05K 7/20327 (2013.01); H05K 7/20318 (2013.01); H05K 7/20818 (2013.01)

(58) Field of Classification Search
CPC .......... H05K 7/20318; H05K 7/20818
See application file for complete search history.

(56) References Cited

U.S. PATENT DOCUMENTS

| 4,470,450 A * | 9/1984 | Bizzell | F28D 15/043 165/104.33 |
| 6,994,151 B2 * | 2/2006 | Zhou | H01L 23/427 174/15.1 |
| 7,488,361 B2 * | 2/2009 | Larnholm | B01D 45/16 55/318 |
| 10,197,425 B2 * | 2/2019 | Pathier | G01F 15/005 |
| 10,655,997 B2 * | 5/2020 | Pathier | G01F 1/74 |
| 11,737,240 B1 * | 8/2023 | Ahmad | F04B 19/24 361/700 |
| 2020/0084918 A1 * | 3/2020 | Shen | H05K 7/20809 |
| 2021/0194022 A1 * | 6/2021 | Kozuka | H01M 8/04231 |
| 2023/0301037 A1 * | 9/2023 | Gao | H05K 7/20809 361/679.53 |
| 2024/0085068 A1 * | 3/2024 | Turney | F25B 25/005 |

* cited by examiner

Primary Examiner — Robert J Hoffberg
(74) Attorney, Agent, or Firm — WOMBLE BOND DICKINSON (US) LLP

(57) ABSTRACT

A server rack, includes a separation chamber that has an input to receive a mixed two-phase fluid from a server chassis, a vapor output at a top portion of the separation chamber, and a liquid output at a bottom portion of the separation chamber. The server rack includes a condenser that is fluidly connected to the vapor output of the separation chamber to receive and condense the vapor to a liquid, and a main outlet that is fluidly connected to both the liquid output of the separation chamber and to a condenser output of the condenser. The main outlet of the server rack is fluidly connected to an external cooling system which supplies the liquid back to the server rack.

20 Claims, 6 Drawing Sheets

TWO-PHASE SYSTEM IN SERVER CLUSTER

FIELD

Embodiments of the present disclosure relate generally to cooling systems for information technology. In particular, a cooling system for information technology may include a two-phase fluid that is managed through one or more server racks.

BACKGROUND

Information Technology (IT) includes technology such as computing devices and supporting electronic components that provide functionality and services that may be made accessible through the internet or a local computer network. The computing devices may provide storage of, or access to, data, websites, computer programs, algorithms, services, and more. For example, a computing device (e.g., a server) may offer services such as email, file storage, file retrieval, support front-end websites, back-end web applications, service-to-service functionality, and more.

IT equipment such as servers and other electronic components (e.g., peripheral devices) can be assembled to a server chassis. The server chassis can include hardware that provides power, thermal management, electronic connectivity, structural support, and other considerations for IT equipment. Each server chassis can then be installed in a server rack, which may also be referred to as an IT rack. A single server chassis may include one or more server nodes, which may each include equipment that is grouped for a related purpose or function, such as performing operations for a common application.

A server node may include a printed circuit board where the electronic components are packaged. A server node may also include cooling components that are thermally coupled to the electronic components, such as a cold plate, or other cooling hardware.

As such, one or more server nodes may be populated to a server chassis, and one or more server chassis may be populated to a server rack. The server rack may include electrical infrastructure to power the various server nodes in each server chassis. The server rack may include mechanical infrastructure such as a frame, rales, guides, brackets, plates, mounting hardware, and more. Importantly, the server rack may include thermal management infrastructure to support cooling of each of the server nodes housed within each server chassis.

As the number and complexity of computing services continues to grow, so does the popularity grow for high power servers. High power servers, such as servers that perform artificial intelligence based operations, cyber-security algorithms, or blockchain technology, may generate large amounts of thermal energy. This trend inevitably leads to thermal challenges and other related issues.

Two-phase cooling systems absorb heat and store it in the form of latent thermal energy by utilizing a phase change process of a working fluid. It may be desirable to integrate a server rack with such a cooling system, however, issues may arise given the complexities which may be specific to a pumped two-phase cooling systems and an IT environment. As such, a solution is desired to address some of the issues and complexities.

DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect. It should be understood that some of the embodiments shown may be combined with other embodiments even if not shown as such in each figure.

DETAILED DESCRIPTION

Figure 1:
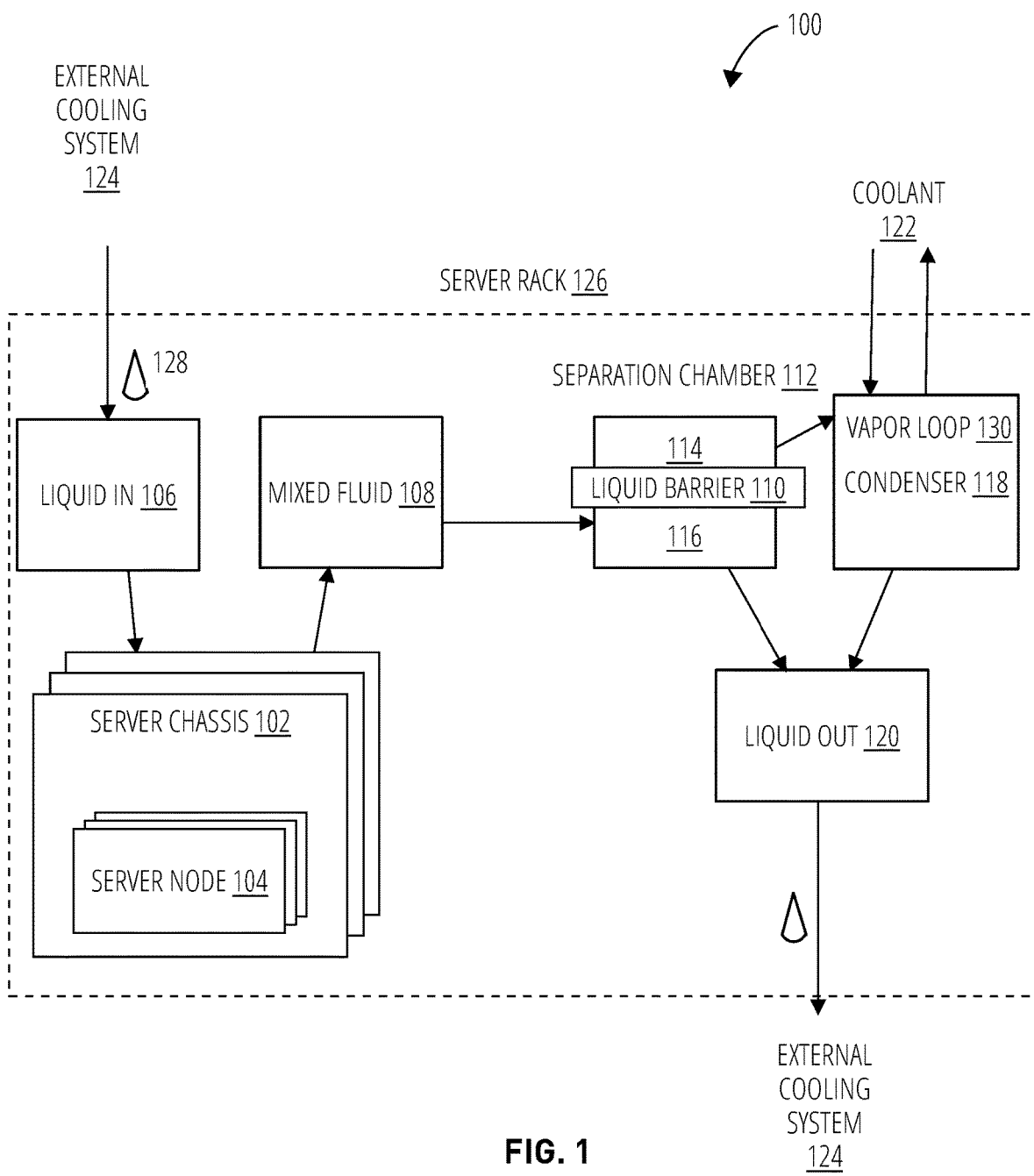
FIG. 1 shows a flow diagram of an example of a two-phase cooling system for IT equipment, in accordance with some embodiments.

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

Embodiments of the present disclosure can address issues identified, such as accommodating a two-phase fluid system in a server rack. In a two-phase pumped cooling system, a two-phase fluid may be circulated to one or more 'hot' locations or heat generation locations in liquid form, such as, for example, a cold plate of a server node. At those locations, the fluid absorbs thermal energy which causes the fluid to undergo phase change from liquid phase to vapor phase. This process absorbs the heat which is contained in the form of latent thermal energy (without changing temperature), however, the vapor must then be circulated out of the 'hot' location and then cooled back to liquid so that it may eventually be circulated back to the 'hot' locations. Latent heat can be understood as energy in the form which is supplied or extracted to change the state of a substance without changing its temperature. As such, there is a need for management of such fluid to and from server chassis within a server rack, and to and from one or more server racks in a data center, in an efficient and effective manner.

In particular, there is a need for an architecture within a server rack that promotes efficient separation of liquid and vapor forms of the two-phase fluid. Further, there is a need for a server rack that efficiently supplies and gathers the two-phase fluid to and from server nodes within the server rack. Further, given the many server chassis that may possibly be present in each server rack and the various server nodes within each server chassis, some of the fluid may inevitably escape through openings, especially when the fluid is in vapor form. Thus, there is a need for a two-phase pumped fluid system that reduces fluid loss and mitigates the risk of the fluid loss. Further, there is a need to provide redundancy in fluid supply for two-phase fluid systems in an IT environment.

Conventional solutions do not consider a complete system-level architecture that includes a pumped two-phase cooling system integrated with a server rack for IT equipment. In addition, conventional systems fail to provide efficient management of vapor and vapor condensation which may be an issue for pumped two-phase cooling systems. Vapor may be difficult to contain so, to reduce inadvertent fluid loss, the vapor should be converted to liquid as immediately as possible.

Aspects of the present disclosure address problems that arise relating to two-phase cooling in an IT environment. Some of the embodiments may promote separation of the fluid into liquid and vapor in the server rack, so that the vapor may be condensed within the server rack near the source of the thermal energy, to quickly return the vapor to its liquid form and do so in a centralized manner. In some embodiments, even if the fluid that exits the server rack contains trace amounts of vapor, other features may provide redundancy to condense the vapor and/or provide additional fluid in the case of fluid-loss.

In one aspect, a server rack may include a separation chamber that comprises an input to receive a two-phase fluid (e.g., having a mix of vapor and liquid) from a server chassis, a vapor output at a top portion of the separation chamber, and a liquid output at a bottom portion of the separation chamber. The server rack includes a condenser that is fluidly connected to the vapor output of the separation chamber to receive and condense the two-phase fluid (in vapor phase) from vapor to liquid. A main outlet of the server rack is fluidly connected to the liquid output of the separation chamber and fluidly connected to a condenser output of the condenser. This main outlet of the server rack is fluidly connected to an external cooling system which supplies the two-phase fluid (in liquid form) back to the server rack.

In such a manner, two-phase fluid may be circulated to and from server chassis within a server rack. The two-phase fluid entering each server chassis is in liquid form. The two-phase fluid exiting each server chassis is mixed, comprising a vapor component and a liquid component. The vapor component may be understood as two-phase vapor phase, and the liquid component may be understood as two-phase liquid phase. The separator directs the vapor phase to the condenser and directs the liquid phase to exit the server rack. The vapor phase flows to the condenser where it is condensed to liquid phase and then directed to exit the server rack. Separation of the mixed two-phase fluid is promoted as it exits each server chassis. The vapor that is separated from the fluid is condensed within the server chassis to promote efficient use of the condenser within the server chassis. The fluid (in liquid form) is sent out of the main outlet of the server rack to a central external cooling system which then recirculates that fluid (in liquid form) back to the server rack.

A two-phase fluid may be understood as a coolant used in a two-phase cooling system. Such a coolant generally has relatively low boiling point compared to a single-phase coolant.

In some embodiments, the external cooling system includes a cooler, which may also be a condenser, to cool the liquid in the external cooling system and/or condense the two-phase fluid in the external cooling system. Although the fluid exiting the server rack and entering the external cooling system should be in liquid form, some vapor may still pass from a server rack to the external cooling system. As such, the external cooling system may include a second condenser to provide redundancy.

In some aspects, the separation chamber of the server chassis includes a liquid barrier between the vapor output and the liquid output, to promote separation of the two-phase fluid. A liquid barrier may be a structure (e.g., one or more screens, a perforated sheet, or other structure) that has a high fluid resistance. This structure allows vapor to pass but presents a barrier to liquid. The condenser input may be upstream of the liquid barrier, so that the fluid that enters the condenser is primarily vapor.

In some aspects, the separation chamber tapers from the top portion to the bottom portion. Additionally, or alternatively, the separation chamber includes a sub-chamber at the top portion that has a larger volume than below the top portion of the separation chamber. In some aspects, the liquid barrier is located in the sub-chamber below (or downstream of) the vapor output.

In some aspects, a second server rack has a second main outlet that is fluidly connected to the external cooling system which supplies the two-phase fluid back to the second server rack. As such, the same cooling system may supply and collect two-phase fluid to and from multiple server racks. In some aspects, additional server racks are fluidly connected to the external cooling system. The same cooling system may serve as a reservoir that replenishes two-phase fluid to multiple server racks, to mitigate the risk of fluid loss, as described.

In some embodiments, the main outlet of the server rack is further fluidly connected to a controllable valve of the second server rack to supply the two-phase fluid to the second server rack. As such, the fluid (in liquid form) that is output from one server rack may be directly used as input to another server rack. That second server rack may have a main inlet that is connected to the central external cooling system, thereby providing additional redundancy of two-phase coolant supply.

In some embodiments, within a server rack, the condenser includes a liquid cooling loop that circulates a cooling fluid to extract heat from the two-phase fluid. This liquid cooling loop is fluidly isolated from the two-phase fluid, and may also be shared among additional server racks. Further, the server rack may include a channel arranged below the condenser (e.g., in a vertical manner) that carries the two-phase fluid (in liquid form) from the condenser to the main outlet of the server rack.

In some embodiments, within the server rack, the separation chamber has a vertical path (e.g., a column) along the server rack to receive the two-phase fluid from the server chassis and one or more additional server chassis housed within the server rack. The separation chamber may directly connect to each of the server chassis within the server rack, thus simultaneously collecting fluid from each server chassis and promoting separation of the fluid to liquid and vapor.

In some aspects, a data center may include a plurality of server racks and at least one external cooling system that supplies a two-phase fluid to the plurality of server racks. A data center may be understood as a facility that supports operation such as electrical utilities, air conditioning, structural accommodations, and other basic needs of each server rack. One or more of the server racks may include a separation chamber that comprises an input to receive a two-phase fluid from a server chassis, a vapor output at a top portion of the separation chamber, and a liquid output at a bottom portion of the separation chamber, a condenser that is fluidly connected to the vapor output of the separation chamber to receive and condense the two-phase fluid from vapor to liquid, and a main outlet that is fluidly connected to the liquid output of the separation chamber and fluidly connected to a condenser output of the condenser. The main outlet of each of the one or more server racks is fluidly connected to the external cooling system which supplies the two-phase fluid back to the one or more server racks.

FIG. 1 shows a flow diagram of an example of a two-phase cooling system 100 for IT equipment, in accordance with some embodiments. The two-phase cooling system 100 may be understood as a pumped two-phase cooling system that circulates a fluid in liquid form to 'hot' components. A pumped two-phase cooling system works in a different manner than other cooling systems that may use a two-phase fluid, such as a thermosiphon system, an immersion cooling system, or a heat pipe, which operate under a different mode of operation.

The two-phase cooling system 100 may include one or more server racks 126 and an external cooling system 124. The two-phase cooling system may utilize a two-phase fluid such as water, a water-based mixture, or other two-phase fluid. Different fluids may have different saturation temperatures. A two-phase fluid may vary from one application to another, depending on the thermal needs of a given system.

A server rack 126 may have one or more server chassis 102 installed upon it. Each of the one or more server chassis 102 may have one or more server nodes 104. Some or all of the server nodes 104 may include a cooling system such as a cold plate that is thermally coupled to electronic components of the respective server node.

At block 106, an external cooling system 124 may supply a two-phase fluid 128, which is in liquid phase, to the server rack 126 through one or more fluid channels. A fluid channel, an output, outlet, inlet, or input, may include fluid hardware such as, for example, hose, pipes, conduit, valves, connectors, joints, or other fluid directing infrastructure. Fluid channels that are generally sealed (e.g., airtight) but may sometimes leak fluid due to inadvertent openings.

The external cooling system 124 supplies this fluid in liquid form to the server rack 126. The server rack 126 directs the fluid to each of the one or more server chassis 102 which may, in turn, direct the fluid to each of the one or more server nodes 104. As the fluid absorbs latent thermal energy from the electronic components of each of the server nodes, the fluid may reach its saturation temperature and at least partially undergo a phase change to vapor form which may also be understood as gas form. As the fluid leaves the server chassis 102 at block 108, the fluid may have a mixed form, part liquid and part vapor. The server rack 126 may direct the fluid coming out of each server chassis 102 to a separation chamber 112.

Separation chamber 112 may include an input to receive the two-phase fluid from the one or more server chassis 102. Separation chamber 112 may include a vapor output at a top portion 114 of the separation chamber, and a liquid output at a bottom portion 116 of the separation chamber.

In some embodiments, separation chamber 112 includes liquid barrier 110 that further promotes separation of the mixed fluid. A condenser 118 is fluidly connected to the vapor output of the separation chamber 112. The condenser receives the two-phase fluid in vapor form (as separated at the separation chamber 112). Condenser 118 may include cooling loops that circulate coolant 122. The cooling loops of the condenser 118 may physically and/or thermally couple with vapor within the condenser to condense the vapor back to liquid. In the separation chamber, gravity may pull the liquid form of the two-phase fluid down to the bottom portion 116. The liquid from the bottom portion 116 of the separation chamber 112 and the condenser 118 may be combined at block 120 and directed back to the external cooling system 124. Coolant 122 may be supplied from a source that is internal to the server rack 126 or external to the server rack 126. The condenser 118 may include a vapor loop 130 that contains the vapor phase. The condenser 118 may receive the vapor phase from the separation chamber 112 through a riser that extends from the separation chamber 112 to the condenser 118. The riser may be oriented to assist the vapor phase to only travel to the condenser 118.

For example, the server rack 126 may include a main outlet that is fluidly connected to the liquid output of the separation chamber 112 and fluidly connected to a condenser output of the condenser 118. The main outlet of the server rack is fluidly connected to the external cooling system which supplies the two-phase fluid back to the server rack. In such a manner, the server rack 126 may collect the mixed two-phase fluid and return all of the two-phase fluid in liquid form to the external cooling system 124. Fluid management and cooling efficiency are improved by separating the vapor and liquid in a mixed two-phase fluid rather than attempting to circulate the two-phase fluid in its mixed form.

It should be understood that, in the figures, some components are not shown for the sake of clarity. For example, the system may include one or more pumps and/or one or more controllable valves which may be arranged strategically within the cooling system at one or more points of the fluid flow, to aid or obstruct the flow of fluid.

Figure 2:
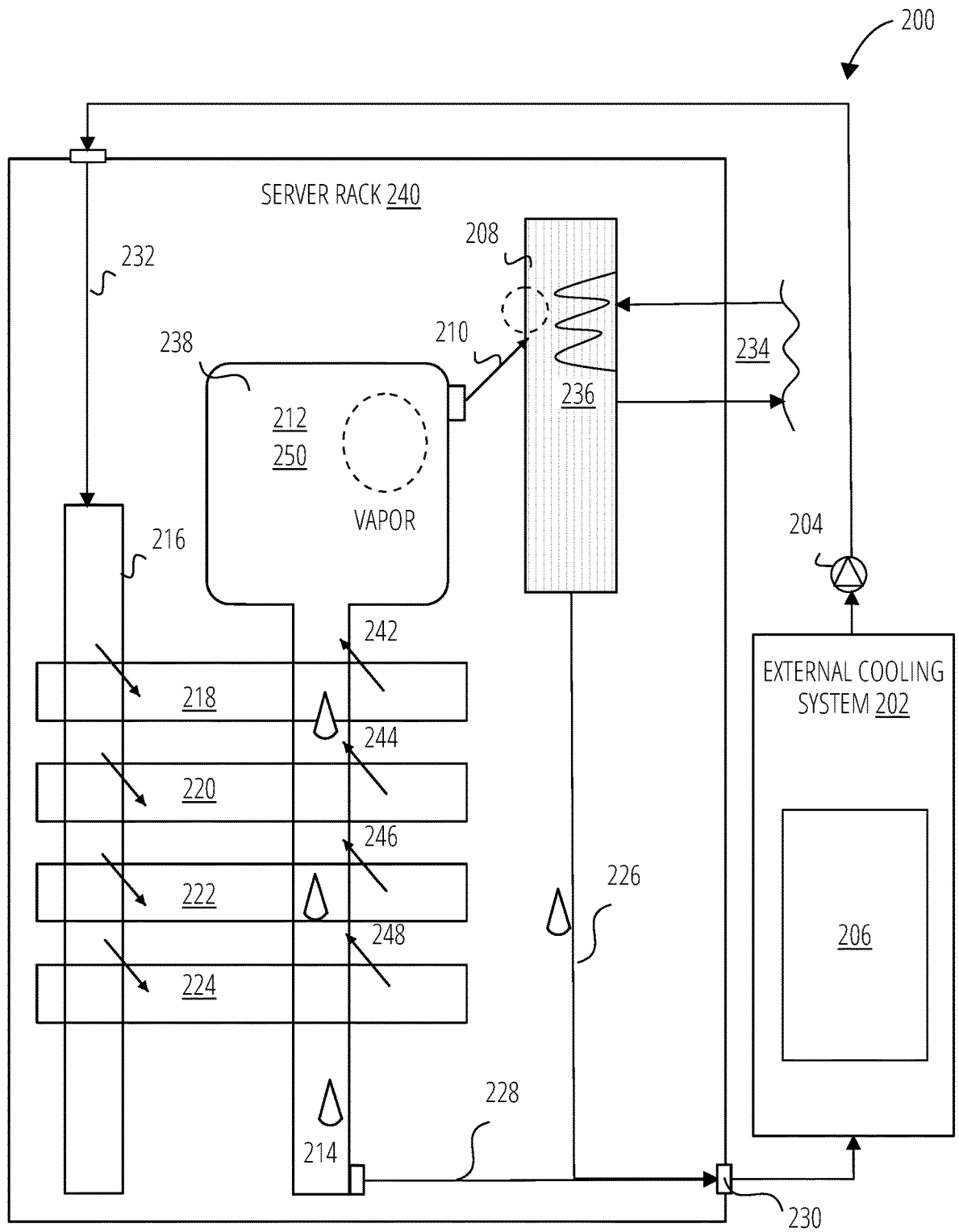
FIG. 2 illustrates an example cooling system that includes a server rack and an external cooling system with a two-phase fluid, in accordance with some embodiments.

FIG. 2 illustrates an example cooling system 200 that includes a server rack and an external cooling system that circulate a two-phase fluid, in accordance with some embodiments. A server rack 240 may be fluidly connected to an external cooling system 202 to receive a two-phase fluid through fluid inlet 232. External cooling system 202 may include an external fluid supply. The fluid at fluid inlet 232 may be in liquid form. The server rack 240 may be fluidly connected to external cooling system 202 through fluid channels which may include various fluid hardware such as connectors, hose, conduit, or combinations thereof, as described. Fluid inlet 232 may be understood as a channel through which the two-phase fluid enters the server rack 240 from the external cooling system 202. Similarly, fluid outlet 230 may be understood as a channel through which the two-phase fluid exits the server rack 240.

The fluid inlet 232 may fluidly connect to a supply manifold 216, downstream of the fluid inlet 232. In some aspects, inlet 232 and supply manifold 216 may be integrated as a single assembly or component. Arrangements of fluid hardware may vary without departing from the scope of the present disclosure. Supply manifold 216 may include one or more supply ports that are connected to one or more server chassis 218, 220, 222, and 224 that are populated to the server rack 240. Although not shown, each server rack may include a server node that may include electronic components and one or more cooling systems (e.g., a cold plate) that are thermally mounted to the electronic components to extract thermal energy from those electronic components.

A server rack 240 may include a separation chamber 238 that comprises one or more fluid inputs (e.g., input 242, 244, 246, or 248) to receive a two-phase fluid from a respective server chassis (e.g., server chassis 218, 220, 222, or 224). Based on the direction of fluid flow, the one or more server chassis are downstream of the inlet 232 and 216. The separation chamber 238 is downstream of the one or more server chassis. Separation chamber 238 includes a vapor output 210 at a top portion 212 of the separation chamber 238 and a liquid output 228 at a bottom portion 214 of the separation chamber 238. As discussed, thermal energy from the electronic components of a server node may cause some of the fluid to evaporate. Thus, when the separation chamber 238 receives the two-phase fluid, it may contain a mix of liquid and vapor. The separation chamber 238 may have a geometry that utilizes gravity, volume, and pressure to promote separation of the two-phase fluid. The bottom portion 214 of the separation chamber 238 collects the liquid form of the fluid, while the top portion 212 collects the vapor form of the fluid. The separation chamber 238 directs the vapor towards vapor output 210 and into condenser 208.

Condenser 208 is fluidly connected to the vapor output 210 of the separation chamber 238 to receive and condense the two-phase fluid from vapor to liquid. Condenser 208 may be fixed in an elevated location relative to top portion 212 and sub-chamber 250. The condenser 208 may include a liquid cooling loop 236 that circulates a coolant. The cooling fluid may be supplied by a cooling fluid source 234 which may be internal to the server rack 240 or external to the server rack 240. The liquid coolant is fluidly isolated from the two-phase fluid. The liquid coolant may be a single phase coolant. Although not shown, the liquid coolant may be cooled through refrigeration techniques, a fan, or other cooling operations. The coolant flows through the condenser 208 and absorbs the thermal energy from the two-phase fluid, thereby converting the vapor to liquid form. The fluid (in liquid form) may be directed to condenser output 226. Condenser output 226 may include a fluid channel arranged below the condenser that carries the two-phase fluid (in liquid form) to the main outlet 230.

Main outlet 230 is fluidly connected to the liquid output 228 of the separation chamber and fluidly connected to a condenser output 226 of the condenser. In such a manner, server rack 240 may have improved efficiency, by separating the fluid coming out each server node, collecting and condensing the vapor, combining the liquid from the condenser with the liquid from the separator, and directing the fluid (in liquid form) out of the server chassis through the main outlet 230. The main outlet of the server rack is fluidly connected to an external cooling system 202 which supplies the two-phase fluid back to the server rack.

It should be understood that even with the architecture shown in server rack 240, some vapor may still make its way into external cooling system 202 from server rack 240. For example, condenser 208 may not always operate. Further, some vapor may still form in channels or pass through condenser 236.

In some embodiments, the external cooling system includes a cooler 206 which is to cool the two-phase fluid in the external cooling system 202 and also condense trace amounts of vapor that may be present in the external cooling system 202. As such, cooler 206 may also be understood as a condenser. Thus, even if the server rack 240 leaks some vapor to the external cooling system 202, the cooler 206 may condense this vapor back to liquid, before being circulated back to server rack 240. External cooling system 202 may include one or more tanks to hold two-phase fluid, one or more pumps such as pump 204, one or more coolers 206, one or more valves (not shown), and/or one or more sensors (not shown).

In some embodiments, the separation chamber 238 may have a vertical path along the server rack 240 to receive the two-phase fluid from each of the one or more server chassis 218, 220, 222, and 224. For example, each server chassis 218, 220, 222, and 224 may have dedicated positions in server rack 240 such that they are stacked above or below each other. The separation chamber 238 may include an enclosed column-shaped chamber that runs vertically so that the separation chamber may fluidly connect to each of the one or more server chassis directly, as illustrated in the figure. Gravity may cause the liquid portion of the fluid to fall to the bottom portion 214. Similarly, gravity and pressure may cause the vapor portion to rise to the top portion 212.

In some embodiments, the separation chamber 238 includes a sub-chamber 250 at the top portion 212. The sub-chamber may have a larger volume than below the top portion of the separation chamber. The sub-chamber may be spherical, a cuboid, or other enclosed shape. Because the vapor will naturally try to expand, the larger volume of the sub-chamber may guide the vapor into the sub-chamber. As such, the geometry of the separation chamber may promote separation of the vapor and liquid forms of the fluid. Further, the separation chamber 238 serves as a central structure to collect the fluid from each of the server chassis 218, 220, 222, and 224. As such, it serves a dual purpose to separate the fluid and to collect the fluid in a centralized manner like a manifold.

In some embodiments, a pump 204 may be arranged in the fluid loop to circulate the two-phase fluid between the server rack and the external cooling system. In some embodiments, although not shown, a pump may be located directly upstream or downstream of the main outlet 230 of the server rack 240, or at the main inlet 232 of the server rack 240. Further, controllable valves may be fitted along various fluid channels such as fluid channel 210 and 226, although omitted here for clarity. In some cases, a controllable valve may be fitted at the inlet 232, as described in other sections.

Figure 3:
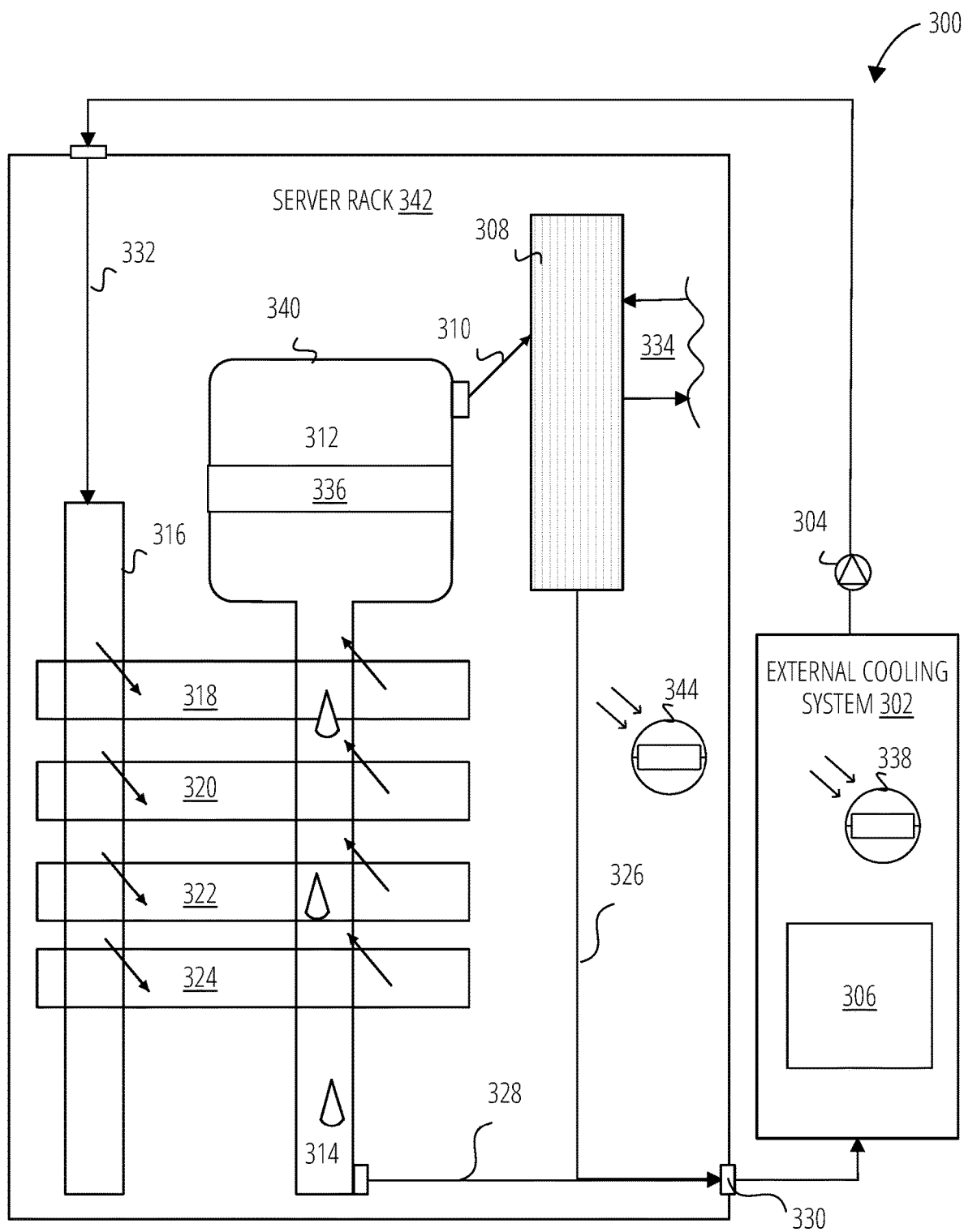
FIG. 3 illustrates an example cooling system that includes a server rack with a liquid barrier that promotes liquid and vapor separation, in accordance with some embodiments.

FIG. 3 illustrates an example cooling system 300 that includes a server rack with a liquid barrier that promotes liquid and vapor separation, in accordance with some embodiments. A server rack 342 may be fluidly connected to an external cooling system 302 to receive a two-phase fluid. The fluid may be in liquid form. One or more fluid channels may carry the two-phase fluid to a fluid inlet 332 of server rack 342.

The fluid inlet 332 may fluidly connect to one or more server chassis 318, 320, 322, and 324 through a supply manifold 316. Server rack 342 may include a separation chamber 340 that comprises one or more inputs to receive a two-phase fluid from a respective server chassis (e.g., server chassis 318, 320, 322, and 324).

Separation chamber 340 includes a vapor output 310 at a top portion 312 of the separation chamber 340 and a liquid output 328 at a bottom portion 314 of the separation chamber 340. The bottom portion 314 of the separation chamber 340 collects the liquid form of the fluid, while the top portion 312 collects the vapor form of the fluid. The separation chamber 340 directs the vapor towards vapor output 310 and into condenser 308. The condenser 308 may receive liquid coolant from a liquid coolant source 334 which may be internal or external to the server rack 342. The coolant flows through the condenser 308 and absorbs the thermal energy from the vapor, thereby converting the vapor to liquid form. The fluid (in liquid form) may be directed to condenser output 326 which may include a fluid channel arranged below the condenser that carries the two-phase fluid (in liquid form) to the main outlet.

A main outlet 330 is fluidly connected to the liquid output 328 of the separation chamber and fluidly connected to a condenser output 326 of the condenser. The main outlet of the server rack is fluidly connected to an external cooling system 302 which supplies the two-phase fluid back to the server rack. In some embodiments, the main outlet may include a plurality of physical outlets. For example, fluid channel 328 and 326 may each exit server rack 342 separately and still be directed to external cooling system 302. A server rack may include variations of fluid channels without departing from the scope of the disclosure.

The separation chamber 340 of server rack 342 may include a liquid barrier 336 arranged between the vapor output 310 and the liquid output 328, to promote separation of the two-phase fluid. Liquid barrier 336 may be understood as a mist extractor that has a decreased vapor resistance, an increased liquid resistance, or both. In some embodiments, the liquid barrier 336 may include a plate with perforations. In some embodiments, the liquid barrier 336 may include a screen or filter with small openings. Due to the structural properties of the liquid barrier 336, vapor has an easier time passing through the liquid barrier 336 than liquid, thereby promoting separation of the fluid to reduce the amount of liquid that enters condenser 308, so that condenser 308 may operate efficiently.

As shown, separation chamber 340 may include a sub-chamber at the top portion 312 that has a larger volume than below the top portion of the separation chamber. The sub-chamber is shown as the bulbous shape at the top portion 312. The larger volume of the sub-chamber guides the vapor towards the sub-chamber and through the liquid barrier 336. Liquid is rejected at liquid barrier 336 and falls down to the bottom portion 314 of the separation chamber 340, where it is directed to fluid output 328. The liquid barrier 336 may be located in the sub-chamber below (e.g., downstream of) the vapor output 310.

The main outlet 330 of server rack 342 may direct fluid (primarily in the form of liquid) to external cooling system 302. The external cooling system 302 may include cooler 306 to cool the liquid and also condense residual amounts of vapor that may be present in external cooling system 302. External cooling system 302 may include one or more sensors 338 which may include fluid level sensors, temperature sensors, or pressure sensors. Similarly, server rack 342 may include one or more sensors 344 which may also include fluid level sensors, temperature sensors, or pressure sensors. These sensors may be used to activate or deactivate one or more pumps such as pump 304, or other pumps that may not be shown, to circulate the two-phase fluid, or coolant to the condenser 308 and/or to cooler 306.

Figure 4:
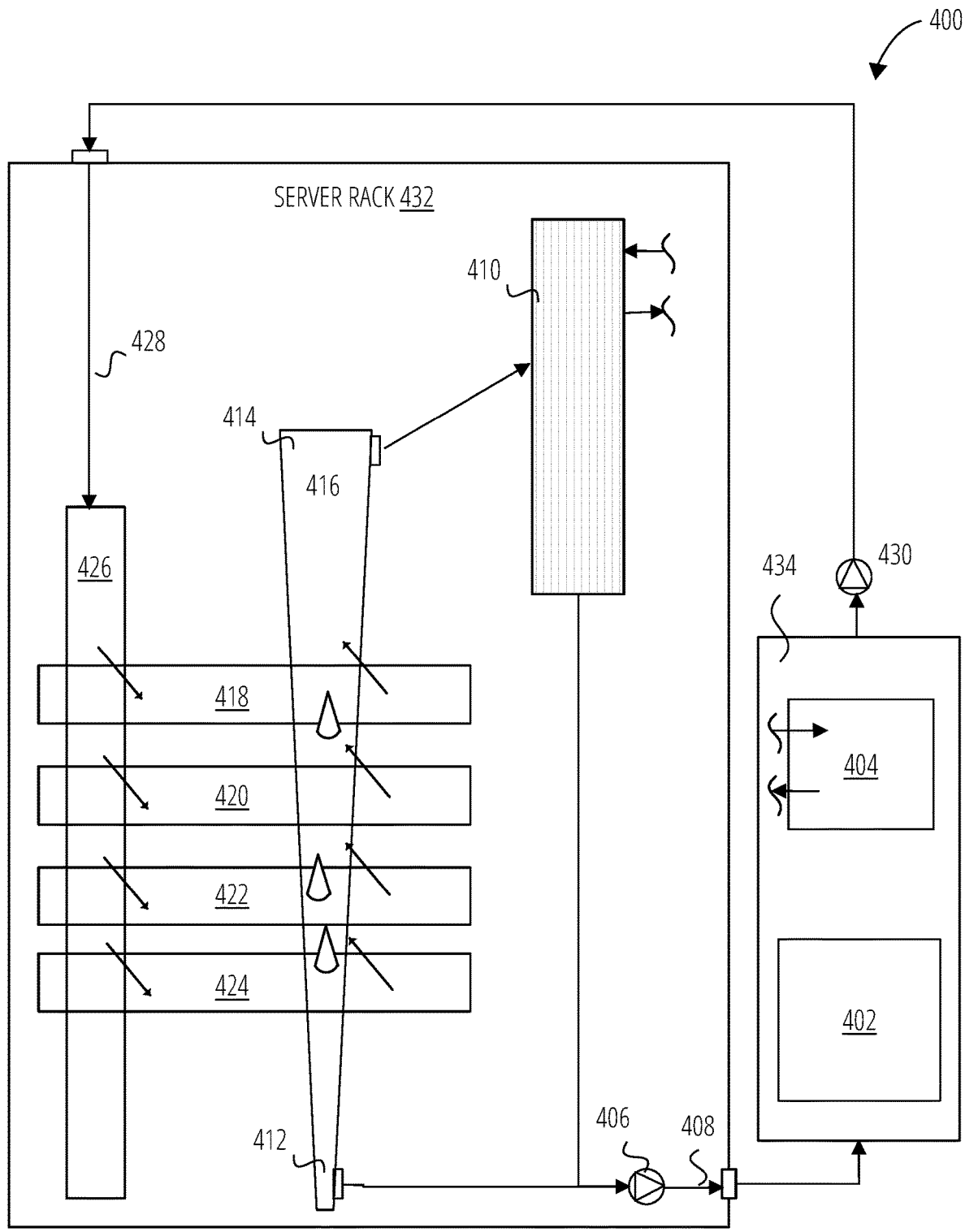
FIG. 4 illustrates an example cooling system that includes a server rack with a tapered separation chamber that promotes liquid and vapor separation, in accordance with some embodiments.

FIG. 4 illustrates an example cooling system 400 that includes a server rack with a tapered separation chamber that promotes liquid and vapor separation, in accordance with some embodiments. As described in other sections, a server rack 432 may be fluidly connected to an external cooling system 434 to receive a two-phase fluid. The two-phase fluid received by the external cooling system is primarily in liquid form. One or more fluid channels may carry the two-phase fluid to fluid inlet 428 of the server rack 432.

The fluid inlet 428 may fluidly connect to one or more server chassis 418, 420, 422, and 424 through a supply manifold 426. The two-phase fluid may flow through server nodes in each server chassis where the two-phase fluid absorbs thermal energy from each server node. At least some of the two-phase fluid undergoes a phase change and the mix of liquid and vapor is received in separation chamber 414. Separation chamber 414 may have column shape that is vertically aligned adjacent to the server chassis 418, 420, 422, and 424 to receive the mixed fluid from each of the server chassis.

Separation chamber 414 includes a vapor output at a top portion 416 of the separation chamber 414 and a liquid output at a bottom portion 412 of the separation chamber 414. The bottom portion 412 of the separation chamber 414 collects the liquid form of the fluid, while the top portion 416 collects the vapor form of the fluid. The separation chamber 414 directs the vapor through a vapor output to a condenser 410.

Separation chamber 414 may taper from the top portion 416 to the bottom portion 412, as shown. A cross-sectional area of the column-shaped separation chamber 414 may decrease at each incrementally lower section in the separation chamber, thereby guide the flow of vapor towards the top portion 416 with the larger volume. The vapor is guided through the vapor output, and into the condenser 410.

It should be understood that, in some embodiments, the tapering shape of separation chamber 414 may be combined with one or more sub-chambers as shown in FIG. 2 and FIG. 3. For example, the separation chamber 414 may have a tapering column shape that has a bulbous sub-chamber at the top portion 416. In some embodiments, a separation chamber may have a plurality of sub-chambers, for example, one at a middle portion in the separation chamber, and one at the top portion. Further, although not shown in this example, a separation chamber 414 with a tapering shape may also include a liquid barrier such as those described in other sections, at or near the top portion of the separation chamber 414.

A main outlet 408 is fluidly connected to the liquid output of the separation chamber and fluidly connected to a liquid output of the condenser. In some embodiments, a pump 406 is positioned upstream or downstream of the main outlet, to pull fluid from the server rack 432 to the external cooling system 434. Additionally, or alternatively, a pump 430 may be arranged between the external cooling system 434 and the server rack 432. The external cooling system 434 may include one or more fluid tanks 402 to contain the two-phase fluid, and a cooler 404 to cool and/or condense the two-phase fluid. Condenser 410 and cooler 404 may both be use liquid coolant to absorb thermal energy from the two-phase fluid. In some embodiments, the condenser 410 of server rack 432 and cooler 404 of the external cooling system 434 may use a common liquid coolant supply.

Figure 5:
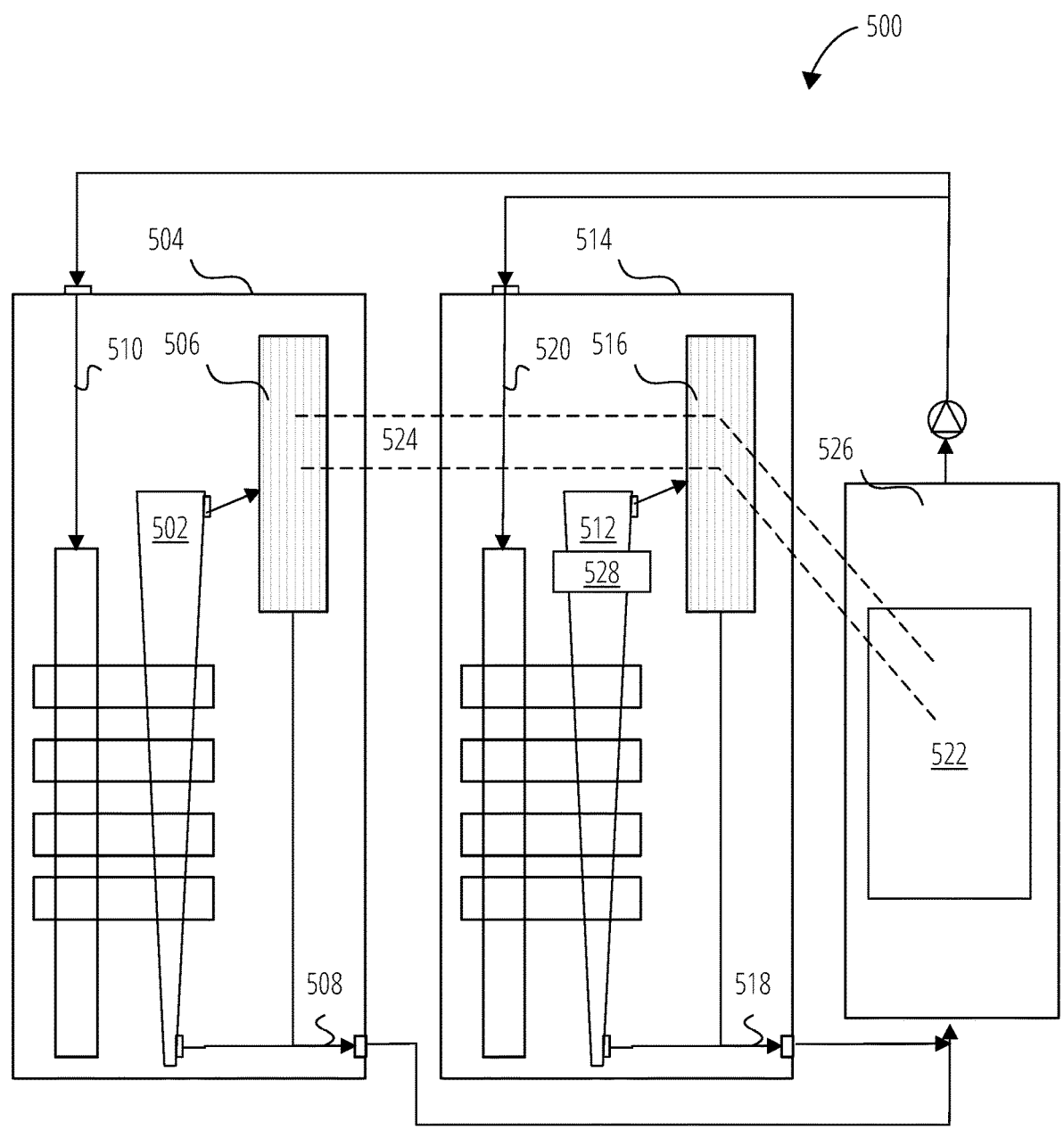
FIG. 5 illustrates an example cooling system with multiple server racks that is designed with a two-phase fluid cooling system, in accordance with some embodiments.

FIG. 5 illustrates an example cooling system with multiple server racks that use two-phase fluid, in accordance with some embodiments. A cooling system 500 may have an external cooling system 526 that distributes fluid to two or more server racks, such as server rack 504 and server rack 514.

Server rack 504 may receive two-phase fluid from external cooling system 526 through a fluid inlet 510. The two-phase fluid is distributed to server chassis that are populated to the server rack 504. The two-phase fluid absorbs the thermal energy from electronic components within each server chassis, and the resulting mixed fluid is collected in separation chamber 502. The separation chamber 502 is configured to promote separation between the liquid form and the vapor form of the two-phase fluid.

The vapor form is directed towards condenser 506. In condenser 506, the vapor is condensed to liquid. The liquid is directed from condenser 506 to output channel 508. Similarly, the liquid that is collected in separation chamber 502 is also directed towards output channel 508. The output channel is connected to external cooling system 526 where it may be cooled by cooler 522 and recirculated back to the two or more server racks.

Server rack 514 operates in the same manner. Server rack 514 may receive two-phase fluid from external cooling system 526 through a fluid inlet 520. The two-phase fluid is distributed to server chassis that are populated to the server rack 514. The two-phase fluid absorbs the thermal energy from electronic components within each server chassis, and the resulting mixed fluid is collected in separation chamber 512. The separation chamber is configured to promote separation between the liquid form and vapor form of the two-phase fluid.

The vapor form is directed towards condenser 516. In condenser 516, the vapor is condensed to liquid. The liquid is directed from condenser 516 to output channel 518. Similarly, the liquid that is collected in separation chamber 512 is also directed towards output channel 518. The output channel is connected to external cooling system 526 where it may be cooled by cooler 522 and recirculated back to the two or more server racks.

With such a configuration, each of the server racks may be said to connect to external cooling fluid supply 526 in parallel. Fluid operation of one of the server racks does not affect fluid operation of the other server rack. In some embodiments, a server rack may have one or more fluid valves and/or pumps to regulate fluid flow through the respective server rack. For example, server rack 504 may include a valve, pump, or both at inlet 510. Similarly, server rack 514 may include a valve, pump, or both at inlet 520. In such a manner, although the server racks may share a common external cooling system 526, they may each regulate the flow of two-phase fluid within that server rack independently. Each server rack 504 and 514 may include one or more pumps arranged in the two-phase fluid loop to circulate the two-phase fluid from the inlets 510, 520, through the server chassis, through the separators 502 and 512, through the condensers 506, 516, and out through outlets 508 and 518.

In some embodiments, a separation chamber such as separation chamber 502 or 512 may have a tapered shape, as shown. Further, a liquid barrier 528 may be deposed in separation chamber 512, downstream of the condenser 516 to further promote the separation between fluid and liquid and reduce the amount of liquid that enters the condenser. Each condenser 506 and 516 may share a common cooling fluid supply and return 524, which may also be shared by cooler 522. The coolant may be circulated by a pump or other means. The coolant may be cooled by a chiller, a fan, refrigeration, and/or other cooling systems. Cooler 522 and condensers 506 and 516 may use the same cooling fluid supply and return 524.

Figure 6:
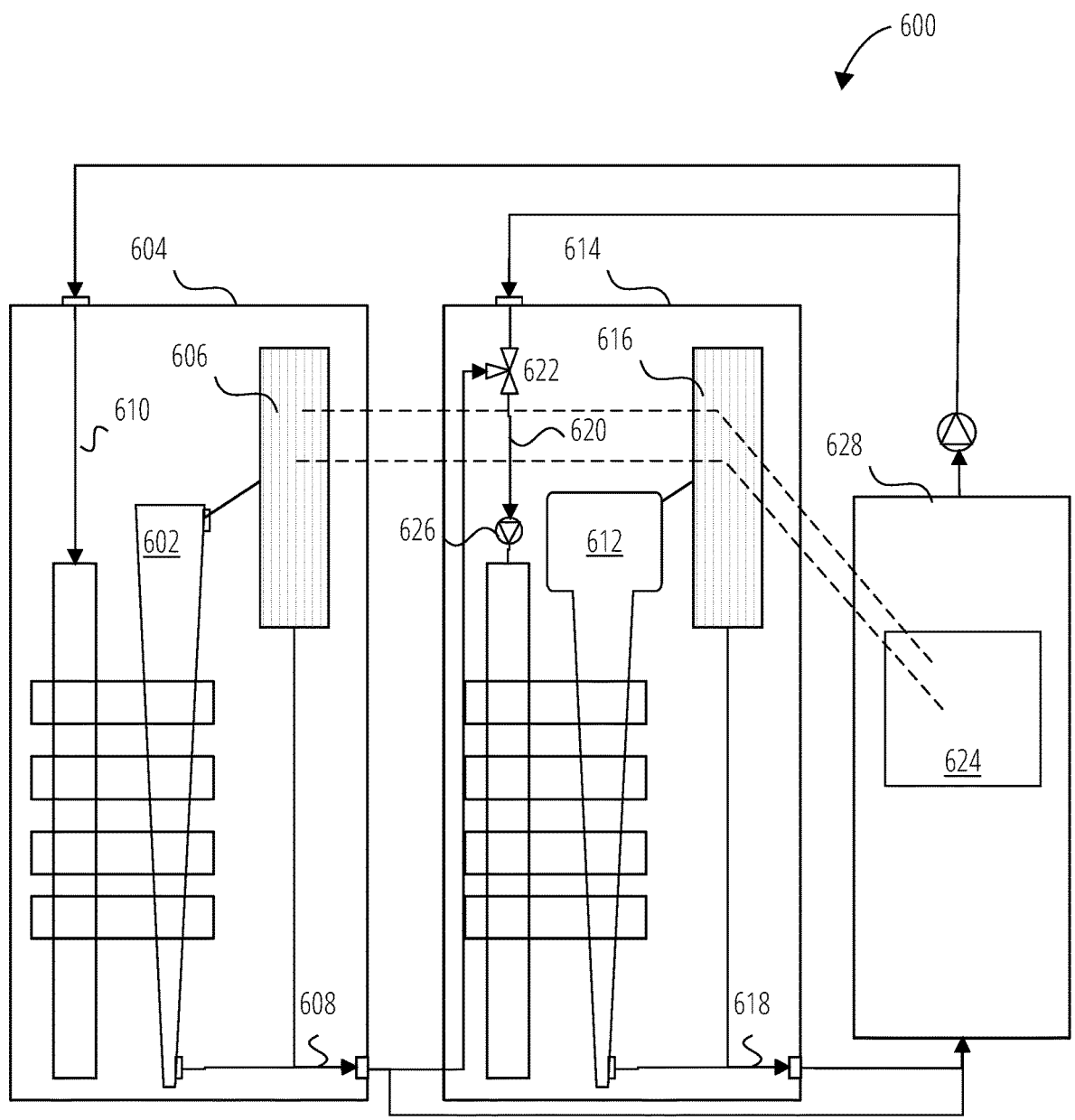
FIG. 6 illustrates an example cooling system with multiple server racks that is designed with a two-phase fluid cooling system, in accordance with some embodiments.

FIG. 6 illustrates an example cooling system with multiple server racks that use two-phase fluid, in accordance with some embodiments. A cooling system 600 may have an external cooling system 628 that distributes two-phase fluid to two or more server racks, such as server rack 604 and server rack 614. Server rack 604 and server rack 614 are fluidly connected to external cooling system 628 in parallel. Further, server rack 604 and server rack 614 are also connected fluidly in series, to which may provide additional redundancy of two-phase fluid supply. Server rack 604 can be understood as being upstream of the server rack 614.

Generally, as described in detail in other examples, each server rack 604 and 614 may circulate the two-phase fluid from the main inlets 610 and 622, through each of the installed server chassis, through the separators 602 and 612, through the condensers 606 and 616, and out through output channels 608 and 618, respectively.

The main outlet 608 of the server rack 604 may be fluidly connected to a controllable valve 622 of the server rack 614 to supply the two-phase fluid to the server rack 614. Controllable valve 622 may be fluidly connected at a main fluid inlet 620 of the server rack 614. The controllable valve 622 may be operated to take fluid from external cooling system 628 or from the main outlet 608 of server rack 604. The controllable valve 622 may, in a first state, connect the fluid inlet to the external cooling system 628 and block fluid from main outlet 608 of server rack 604. In a second state, controllable valve 622 may connect the fluid inlet 620 of server rack 614 to the fluid outlet 608 of server rack 604 and block the fluid from the external cooling system 628. Control of the valve state may depend on sensed pressure, temperature, fault conditions (e.g., if the external cooling system 628 is no operative), or other conditions. Control of valves or pumps may be performed by one or more computing devices. Valves may have solenoids or other controllable actuators.

In some embodiments, pump 626 may be arranged in the fluid inlet path to draw two-phase fluid into server rack 614 from the outlet of server rack 604 or from the external cooling system 628. External cooling system 628 may include a cooler 624 which cools and condenses the two-phase fluid. Although server rack 604 and server rack 614 are shown as having different features, (e.g., inlet loop 610 and 620), in some embodiments, they can be identical or have the same features.

Further, although not shown, additional server racks may be fluidly attached in the same manner. For example, a third server rack may have a controllable valve in its main inlet line that receives two-phase fluid from both the external cooling system 628 and from the main outlet 618 of the server rack 614. A fourth server rack may be connected to the external cooling system and to the third server rack in the same manner, and so on. Thus, a plurality of server racks may be connected in a series and parallel manner, utilizing the two-phase fluid from the external cooling system in most cases, and using two-phase fluid from a downstream server rack in other cases.

In some embodiments, separation chamber 612 may have a sub-chamber at a top portion of the separation chamber. The sub-chamber may have a bulbous shape that protrudes from the top section and has an increased volume relative to the rest of the separation chamber. Further, the column leading to the sub-chamber may be tapered to increase in cross-sectional area at higher and higher points in the column. As such, vapor is promoted to rise into the sub-chamber where it may be directed into condenser 616. In some embodiments, although not shown, the separation chamber 612 may include a liquid barrier that prevents liquid from entering condenser 616. Although not shown in each example, a server rack can, in some embodiments, include various other supporting components. For example, a server rack can a rack management unit (RMU). The server chassis can also be referred to as a server blade that can be inserted into an array of server slots respectively from frontend or backend of the server rack. A server rack can be either open to the environment or partially contained by a rack container. The server rack can include one or more cooling fans that can generate airflow from a frontend to a backend of the server rack. In some embodiments, a server rack may include a cooling fan for each server chassis. The cooling fans may be mounted on each server chassis to generate airflow through the server chassis. In some embodiments, the server rack may include a heat exchanger, liquid pump, a pump controller, a fluid reservoir, a power supply, sensors and more. The heat exchanger may be a liquid-to-liquid heat exchanger that includes a first loop with inlet and outlet ports having a first pair of liquid connectors coupled to external liquid supply/return lines to form a primary loop. The liquid supply/return lines may be fluidly connected to a set of room manifolds, which may be coupled to an external heat removal system, or external cooling loop.

Each of the server chassis may house one or more servers which may include one or more components such as, for example, central processing units or CPUs, graphical processing units (GPUs), memory, and/or storage devices. Each component may perform data processing tasks, where the component may include software installed in a storage device, loaded into the memory, and executed by one or more processors to perform the data processing tasks. At least some of these components may be attached to the bottom of any of the cold plates as described above. A server may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

A server rack may further include an optional RMU configured to provide and manage power supplied to servers and fan modules. The RMU may be coupled to a power supply unit to manage the power consumption of the power supply unit. The power supply unit may include the necessary circuitry (e.g., an alternating current (AC) to direct current (DC) or DC to DC power converter, backup battery, transformer, or regulator, etc.,) to provide power to the rest of the components of the server rack. Aspects of the cooling distribution system can be flexible and deployable in different system architectures; for example, a server rack may be deployed with a localized pumping system (e.g., a closed system architecture) or central pumping system (e.g., an open system architecture).

Some embodiments may include a non-transitory machine-readable medium (such as microelectronic memory) having stored thereon instructions, which program one or more data processing components (generically referred to here as a "processor") to perform operations described herein. In some embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

The invention claimed is:

1. A server rack, comprising:
a plurality of server chassis;
a separation chamber comprising inputs to respectively receive a mixed two-phase coolant from the plurality of server chassis, a vapor output at a top portion of the separation chamber, and a liquid output at a bottom portion of the separation chamber, wherein the separation chamber comprises a geometry that is configured the mixed two-phase coolant to a liquid and a vapor, direct the liquid to the liquid output, and direct the vapor to the vapor output;
a condenser that is fluidly connected to the vapor output of the separation chamber to receive and condense the vapor to the liquid; and
a main outlet that is fluidly connected to the liquid output of the separation chamber and fluidly connected to a condenser output of the condenser, wherein the main outlet of the server rack is fluidly connected to an external cooling system which supplies the liquid back to the server rack.

2. The server rack of claim 1, wherein the external cooling system includes a cooler to condense trace amounts of the vapor to the liquid.

3. The server rack of claim 1, wherein the separation chamber includes a liquid barrier between the vapor output and the liquid output, to promote separation of the vapor and the liquid.

4. The server rack of claim 1, wherein the separation chamber tapers from the top portion to the bottom portion.

5. The server rack of claim 1, wherein the separation chamber includes a sub-chamber at the top portion that has a larger volume than below the top portion of the separation chamber.

6. The server rack of claim 5, wherein a liquid barrier is located in the sub-chamber below the vapor output.

7. The server rack of claim 1, wherein a second server rack has a second main outlet that is fluidly connected to the external cooling system which supplies the liquid back to the second server rack.

8. The server rack of claim 7, wherein the main outlet of the server rack is further fluidly connected to a controllable valve of the second server rack to supply the liquid to the second server rack.

9. The server rack of claim 1, wherein the condenser includes a liquid cooling loop that circulates a cooling fluid in the condenser to absorb thermal energy from the vapor, and a channel below the condenser that carries the liquid to the main outlet.

10. The server rack of claim 1, wherein the separation chamber has a vertical path along the server rack to receive the liquid and the vapor from the plurality of server chassis that are housed within the server rack.

11. A cooling system for information technology (IT) equipment, comprising:
    a server rack, comprising:
        a plurality of server chassis,
        a separation chamber comprising inputs to respectively receive a mixed two-phase coolant from the plurality of server chassis that includes a vapor and a liquid, a vapor output at a top portion of the separation chamber, and a liquid output at a bottom portion of the separation chamber, where the separation channel comprises a geometry that is configured that is configured to separate the mixed two-phase coolant to the liquid and the vapor, direct the liquid to the liquid output, and direct the vapor to the vapor output,
        a condenser that is fluidly connected to the vapor output of the separation chamber to receive and condense the vapor to the liquid,
        a main outlet that is fluidly connected to the liquid output of the separation chamber and fluidly connected to a condenser output of the condenser; and
    an external cooling system that is fluidly connected to the main outlet of the server rack, to supply the liquid back to the server rack.

12. The cooling system of claim 11, wherein the external cooling system includes a cooler to condense trace amounts of the vapor to the liquid.

13. The cooling system of claim 11, wherein the separation chamber includes a liquid barrier between the vapor output and the liquid output, to promote separation of the vapor and the liquid.

14. The cooling system of claim 11, wherein the separation chamber tapers from the top portion to the bottom portion.

15. The cooling system of claim 11, wherein the separation chamber includes a sub-chamber at the top portion that has a larger volume than below the top portion of the separation chamber.

16. The cooling system of claim 15, wherein a liquid barrier is located in the sub-chamber below the vapor output.

17. The cooling system of claim 11, wherein a second server rack has a second main outlet that is fluidly connected to the external cooling system which supplies the liquid back to the second server rack.

18. The cooling system of claim 17, wherein the main outlet of the server rack is further fluidly connected to a controllable valve of the second server rack to supply the liquid to the second server rack.

19. The cooling system of claim 11, wherein the condenser includes a liquid cooling loop that circulates a cooling fluid in the condenser to absorb thermal energy from the vapor, and a channel below the condenser that carries the liquid to the main outlet.

20. The cooling system of claim 11, wherein the separation chamber has a vertical path along the server rack to receive the liquid and the vapor from the plurality of server chassis.

* * * * *